(12) United States Patent
Fu et al.

(10) Patent No.: US 8,444,301 B2
(45) Date of Patent: May 21, 2013

(54) LENS AND ILLUMINATION DEVICE

(75) Inventors: Ren-Tao Fu, Shenzhen (CN); Chin-Chung Chen, New Taipei (TW)

(73) Assignees: Fu Zhen Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 122 days.

(21) Appl. No.: 13/191,471

(22) Filed: Jul. 27, 2011

(65) Prior Publication Data

US 2012/0314423 A1 Dec. 13, 2012

(30) Foreign Application Priority Data

Jun. 7, 2011 (CN) .......................... 2011 1 0150784

(51) Int. Cl.
*F21V 5/04* (2006.01)

(52) U.S. Cl.
USPC ...................................... 362/311.09; 362/335

(58) Field of Classification Search
CPC ................. B29D 1/00; G02B 1/00; C03B 9/00
USPC .............. 362/800, 311.09, 308–310, 311.02, 362/311.06
See application file for complete search history.

(56) References Cited

U.S. PATENT DOCUMENTS

| | | | | |
|---|---|---|---|---|
| 7,329,029 | B2 * | 2/2008 | Chaves et al. | 362/329 |
| 7,348,723 | B2 * | 3/2008 | Yamaguchi et al. | 313/501 |
| 7,422,347 | B2 * | 9/2008 | Miyairi et al. | 362/335 |
| 2006/0083000 | A1 * | 4/2006 | Yoon et al. | 362/311 |
| 2008/0013322 | A1 * | 1/2008 | Ohkawa | 362/311 |
| 2012/0057101 | A1 * | 3/2012 | Iiyama et al. | 349/64 |
| 2012/0268946 | A1 * | 10/2012 | Chen et al. | 362/311.09 |

* cited by examiner

*Primary Examiner* — Tracie Y Green
(74) *Attorney, Agent, or Firm* — Altis Law Group, Inc.

(57) ABSTRACT

A lens includes a light incident surface and a light exiting surface. The light exiting surface includes a first curved surface, a first convex surface, a second convex surface, a second curved surface, and a third curved surface. The first curved surface is located at the center of the light exiting surface. The first and second convex surfaces are arranged at two opposite sides of the first curved surface respectively for converging the light exiting therefrom, the first convex surface, the first curved surface, and the second convex surface connect in sequence along a first direction. The first and third curved surface are arranged at another two opposite sides of the first curved surface respectively; the second curved surface, the first curved surface, and the third curved surface connect in sequence along a second direction substantially perpendicular to the first direction.

17 Claims, 5 Drawing Sheets

LENS AND ILLUMINATION DEVICE

BACKGROUND

1. Technical Field

The present disclosure relates to optical field and, particularly, to a lens and an illumination device having the lens.

2. Description of Related Art

At present, the light emitted from many types of light sources, such as light emitting diodes, discharge lamps, halogen lamps, etc., has a large divergence angle. When one of these types of light sources is provided for illumination, a focus lens is generally required at the front of it to reduce the divergence angle. Typically, the focus lens makes the illumination area of the light source round; however, in some products, such as road lamps, tunnel lamps, etc., the illumination area of the light source should be rectangular to improve the efficiency of the light utilization of the light source.

What is needed is a lens which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
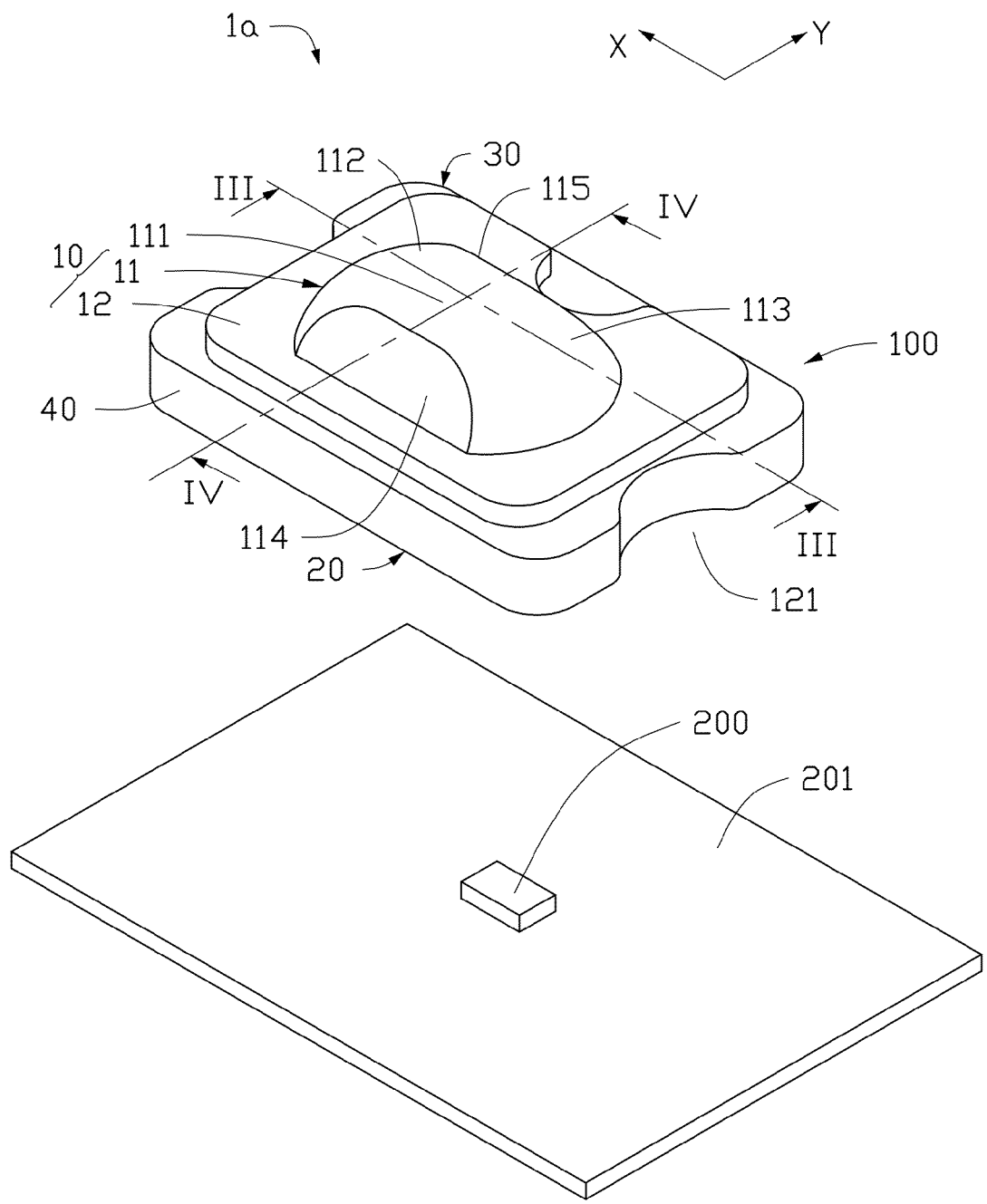
FIG. 1 is a schematic view of an illumination device according to an exemplary embodiment.

Referring to FIG. 1, an illumination device 1a according to an exemplary embodiment is shown. The illumination device 1a includes a lens 100 and a light source 200. The illumination device 1a can be used as a road lamp, a garden lamp, a tunnel lamp, etc.

The light source 200 can be a light emitting diode, a discharge lamp, a halogen lamp etc. In the present embodiment, the light source 200 is a light emitting diode, and the light emitting diode is mounted on a circuit board 201.

The lens 100 includes a first surface 10, a second surface 20 opposite to the first surface 10, a first side surface 30 connecting between the first surface 10 and the second surface 20, and a second side surface 40 opposite to the first side surface 30. When the illumination device 1a is used as a road lamp or a tunnel lamp, the second side surface 40 will be arranged facing towards the center of a road, and the first side surface 30 will be arranged facing away from the center of the road. The first side surface 30 and the second side surface 40 are substantially parallel to the road.

The first surface 10 of the lens 100 includes a light exiting surface 11 at the center of the lens 100, and a mounting surface 12 surrounding the light exiting surface 11. The mounting surface 12 is configured for engaging with a housing (not shown) to fix the lens 100, during assembling of the lens 100. In the present embodiment, the lens 100 defines three cutouts 121 recessed respectively from two opposite lateral ends and the first side surface 30 thereof. The cutouts 121 provide positioning function to thereby improve the efficiency of assembling the lens 100 into a lamp.

The light exiting surface 11 protrudes from the center of the first surface 10. The length of the light exiting surface 11 along the first direction X is larger than the length of the light exiting surface 11 along the second direction Y. The first direction X is substantially perpendicular to the second direction Y. When the illumination device 1a is used as a road lamp or a tunnel lamp, the first direction X will be arranged substantially parallel to the road, and the second direction Y will be arranged substantially perpendicular to the road. In the present embodiment, the light exiting surface 11 is substantially oval-shaped. The length of the light exiting surface 11 along the first direction X is substantially two times of the length of the light exiting surface 11 along the second direction Y.

The light exiting surface 11 includes a first curved surface 111, a first convex surface 112, a second convex surface 113, a second curved surface 114 and a third curved surface 115. The first curved surface 111 is located at the center of the light exiting surface 11. The first convex surface 112 and the second convex surface 113 are arranged at two opposite sides of the first curved surface 111. The first convex surface 112, the first curved surface 111, and the second convex surface 113 are connected in sequence along the first direction X. The second curved surface 114 and the third curved surface 115 are arranged at another two opposite sides of the first curved surface 111. The second curved surface 114, the first curved surface 111, and the third curved surface 115 are connected in sequence along the second direction Y. In the present embodiment, the first curved surface 111 connects to the first convex surface 112 and the second convex surface 113 smoothly. The first convex surface 112 and the second convex surface 113 are arranged symmetrically at two sides of first curved surface 111, and the second curved surface 114 and the third curved surface 115 are arranged symmetrically at another two sides of first curved surface 111. When the illumination device 1a is used as a road lamp or a tunnel lamp, the second curved surface 114 will be arranged adjacent to the center of the road, and the third curved surface 115 will be arranged away from the center of the road.

Figure 3:
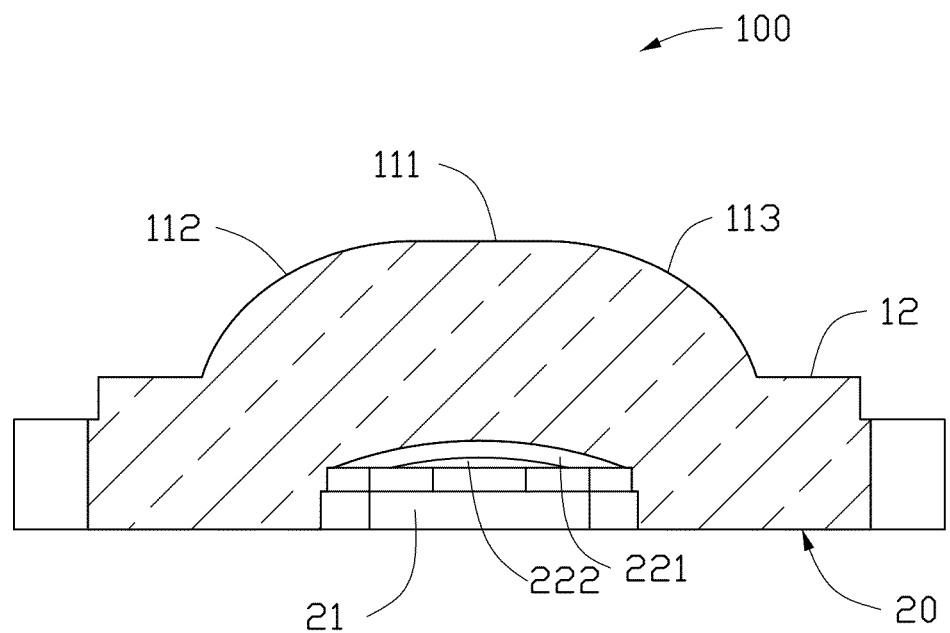
FIG. 3 is a cross sectional view of the lens of the illumination device of FIG. 1, taken along line III-III of FIG. 1.
Figure 4:
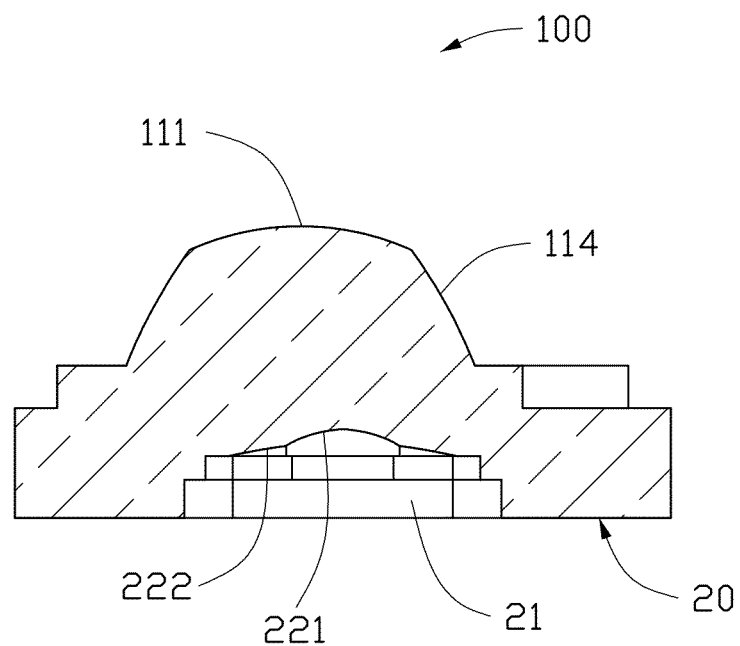
FIG. 4 is a cross sectional view of the lens of the illumination device of FIG. 1, taken along line IV-IV of FIG. 1.

Further referring to FIGS. 3 and 4, the first curved surface 111 can diverge the light exiting therefrom on the first direction X, and can converge the light exiting therefrom on second direction Y. Thus, the light exiting from the first curved surface 111 has a relatively large divergence angle on the first direction X, and has a relatively small divergence angle on the second direction Y.

The first convex surface 112 and the second convex surface 113 can converge the light exiting therefrom. The light converging power of the first convex surface 112 on the first direction X is smaller than the light converging power of the first convex surface 112 on the second direction Y. The light converging power of the second convex surface 113 on the first direction X is smaller than the light converging power of the second convex surface 113 on the second direction Y. Thus, the light exiting from the first convex surface 112 and the second convex surface 113 has a relatively large divergence angle on the first direction X, and has a relatively small divergence angle on the second direction Y. In the present embodiment, each of the first convex surface 112 and the second convex surface 113 is an ellipsoidal surface with a long axis thereof substantially parallel to the first direction X, and a short axis thereof substantially parallel to the second direction Y.

The second curved surface 114 and third curved surface 115 can diverge the light exiting therefrom on the first direction X, and can converge the light exiting therefrom on second direction Y. In the present embodiment, each of the second curved surface 114 and third curved surface 115 is a cylindrical surface. The light converging power of the second curved surface 114 and third curved surface 115 on the second direction Y is larger than that of the first curved surface 111, the first convex surface 112 and the second convex surface 113.

It is understood, the shapes of the first curved surface 111, the first convex surface 112, the second convex surface 113, the second curved surface 114, and the third curved surface 115 are not limited to the present embodiment; these surfaces can also be other shapes which have the corresponding functions.

Figure 2:
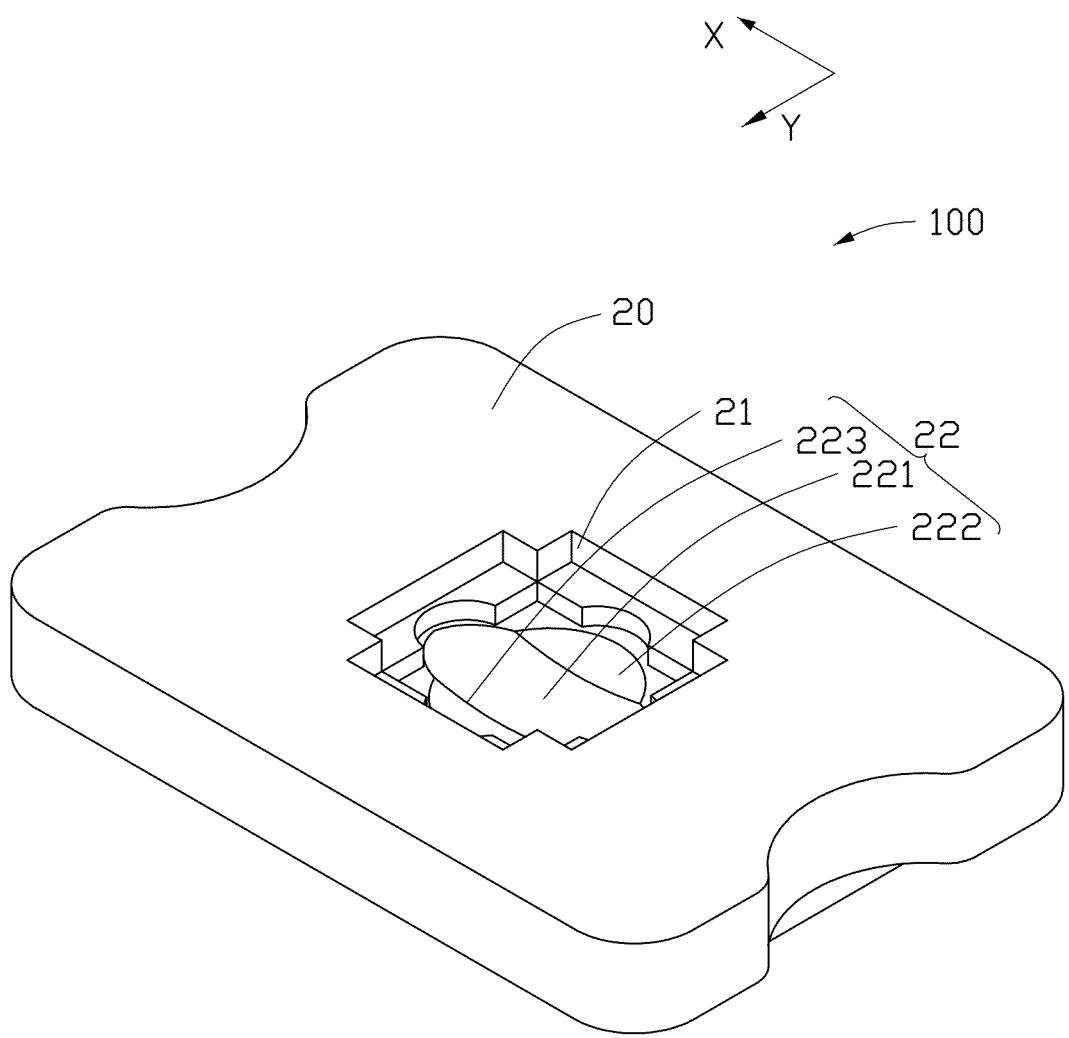
FIG. 2 is a schematic view of a lens of the illumination device of FIG. 1, viewed from the light incident side of the lens.

Referring to FIGS. 2-4, the second surface 20 of the lens 100 defines a receiving groove 21 at the center thereof. The receiving groove 21 is used for receiving the light source 200. The lens 100 includes a light incident surface 22 at the bottom of the receiving groove 21. The light incident surface 22 can be a flat surface or a curved surface. In the present embodiment, the light incident surface 22 includes a number of curved surfaces. In order to increase the amount of light exiting from the light exiting surface 11 shining towards the side of the lens 100 adjacent to the second curved surface 114, the receiving groove 21 can be arranged adjacent to the second curved surface 114 relative to the third curved surface 115. In other embodiments, the receiving groove 21 can also be omitted, and the light source 200 is arranged at a side of the lens 100 facing the second surface 20.

In the present embodiment, the light incident surface 22 includes a first concave curved surface 221, a second concave curved surface 222, and a third concave curved surface 223. The second concave curved surface 222 and the third concave curved surface 223 are arranged symmetrically at two sides of first concave curved surface 221. The second concave curved surface 222, the first concave curved surface 221, and the third concave curved surface 223 are connected in sequence along the second direction Y.

The first concave curved surface 221 can diverge the light accessing therein. The light diverging power of the first concave curved surface 221 on the first direction X is smaller than the light diverging power of the first concave curved surface 221 on the second direction Y.

The light diverging power of each of the second concave curved surface 222 and the third concave curved surface 223 on the second direction Y is smaller than that of the first concave curved surface 221; thus, the light exiting from the light exiting surface 11 will be more uniform. Each of the second concave curved surface 222 and the third concave curved surface 223 can be an ellipsoidal surface.

The first curved surface 111, the first convex surface 112, the second convex surface 113, the second curved surface 114, and the third curved surface 115 cooperatively can make the illumination device 1a have a substantially rectangular illumination area.

Figure 5:
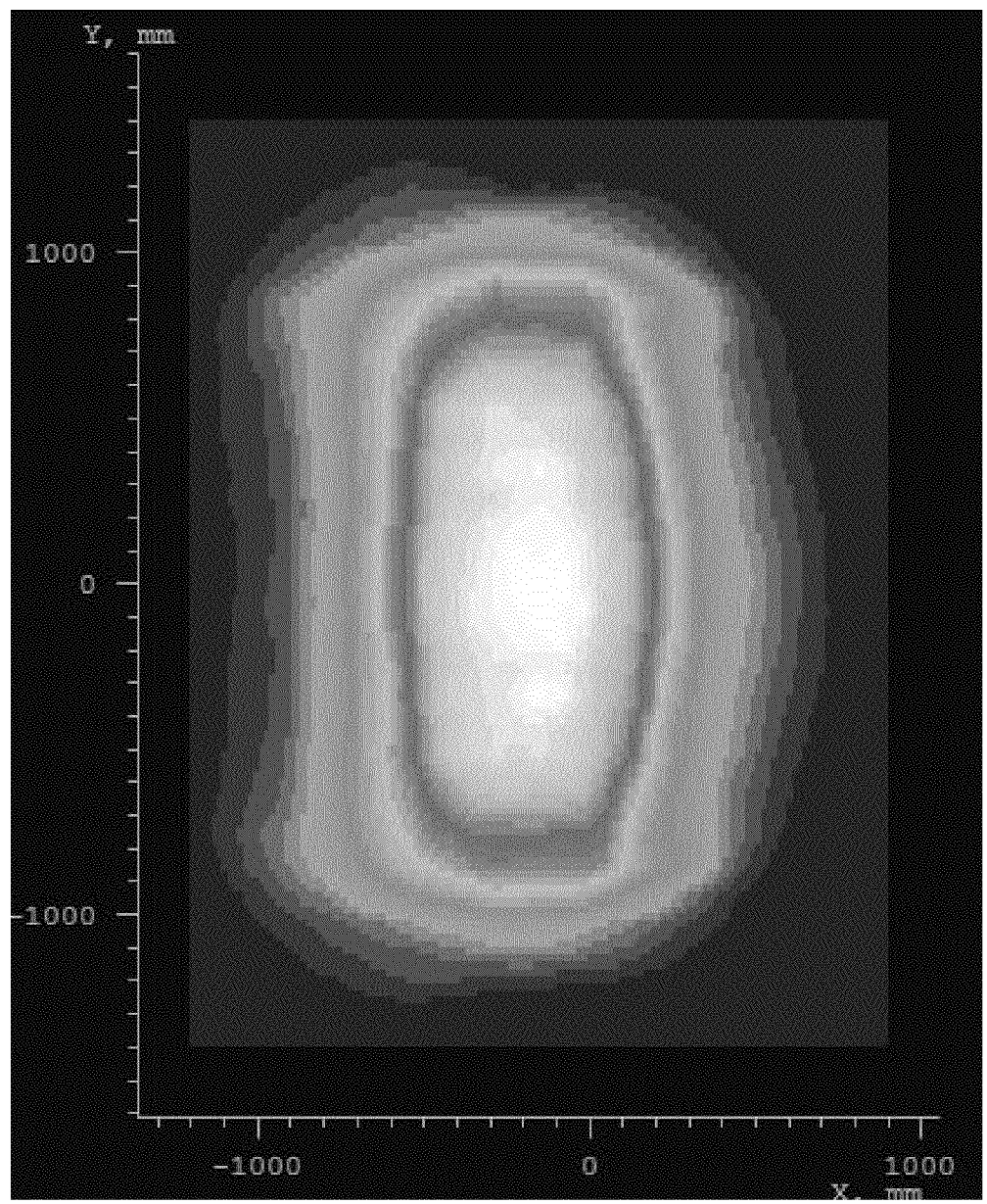
FIG. 5 is an illuminance distribution map of the illumination device of FIG. 1.

Referring to FIG. 5, from the illuminance distribution map of the illumination device 1a, it is found that the illumination area of the illumination device 1a is substantially rectangular, and the illumination device 1a has a relatively uniform light distribution.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A lens comprising:
   a light incident surface; and
   a light exiting surface, the light exiting surface comprising:
   a first curved surface located at the center of the light exiting surface;
   a first convex surface and a second convex surface arranged at two opposite sides of the first curved surface respectively for converging the light exiting therefrom, the first convex surface, the first curved surface, and the second convex surface connecting in sequence along a first direction;
   a second curved surface and a third curved surface arranged at another two opposite sides of the first curved surface respectively, the second curved surface, the first curved surface, and the third curved surface connecting in sequence along a second direction, the second direction being substantially perpendicular to the first direction,
   wherein, the first curved surface diverges the light exiting therefrom on the first direction, and converges the light exiting therefrom on second direction, the light converging power of each of the first convex surface and the second convex surface on the first direction is smaller than the light converging power of each of the first convex surface and the second convex surface on the second direction, the second curved surface and third curved surface diverge the light exiting therefrom on the first direction, and converge the light exiting therefrom on the second direction.

2. The lens as claimed in claim 1, wherein the length of the light exiting surface along the first direction is larger than the length of the light exiting surface along the second direction.

3. The lens as claimed in claim 1, wherein the lens is used in a road lamp or a tunnel lamp, the first direction is arranged substantially parallel to the road, and the second direction is arranged substantially perpendicular to the road.

4. The lens as claimed in claim 1, wherein each of the first convex surface and the second convex surface is an ellipsoidal surface with a long axis thereof substantially parallel to the first direction, and a short axis thereof substantially parallel to the second direction.

5. The lens as claimed in claim 1, wherein each of the second curved surface and third curved surface is a cylindrical surface.

6. The lens as claimed in claim 1, wherein the light incident surface comprises a first concave curved surface, the first concave curved surface diverges the light accessing therein, the light diverging power of the first concave curved surface on the first direction is smaller than the light diverging power of the first concave curved surface on the second direction.

7. The lens as claimed in claim 6, wherein the light incident surface comprises a second concave curved surface and a third concave curved surface, the second concave curved surface and the third concave curved surface are arranged symmetrically at two sides of first concave curved surface, the second concave curved surface, the first concave curved surface, and the third concave curved surface are connected in sequence along the second direction, the light diverging power of each of the second concave curved surface and the third concave curved surface on the second direction is smaller than that of the first concave curved surface.

8. An illumination device comprising:
a light source; and
a lens, the lens comprising:
  a light incident surface facing the light source; and
  a light exiting surface, the light exiting surface comprising:
    a first curved surface located at the center of the light exiting surface;
    a first convex surface and a second convex surface arranged at two opposite sides of the first curved surface respectively for converging the light exiting therefrom, the first convex surface, the first curved surface, and the second convex surface connecting in sequence along a first direction;
    a second curved surface and a third curved surface arranged at another two opposite sides of the first curved surface respectively, the second curved surface, the first curved surface, and the third curved surface connecting in sequence along a second direction, the second direction being substantially perpendicular to the first direction,
  wherein, the first curved surface diverges the light exiting therefrom on the first direction, and converges the light exiting therefrom on second direction, the light converging power of each of the first convex surface and the second convex surface on the first direction is smaller than the light converging power of each of the first convex surface and the second convex surface on the second direction, the second curved surface and third curved surface diverge the light exiting therefrom on the first direction, and converge the light exiting therefrom on the second direction.

9. The illumination device as claimed in claim 8, wherein the lens defines a receiving groove for receiving the light source, and the light incident surface is at the bottom of the receiving groove.

10. The illumination device as claimed in claim 9, wherein the receiving groove is arranged adjacent to the second curved surface relative to the third curved surface.

11. The illumination device as claimed in claim 10, wherein the illumination device is used as a road lamp or a tunnel lamp, the second curved surface is arranged adjacent to the center of the road, and the third curved surface is arranged away from the center of the road.

12. The illumination device as claimed in claim 8, wherein the length of the light exiting surface along the first direction is larger than the length of the light exiting surface along the second direction.

13. The illumination device as claimed in claim 8, wherein illumination device is used as a road lamp or a tunnel lamp, the first direction is arranged substantially parallel to the road, and the second direction is arranged substantially perpendicular to the road.

14. The illumination device as claimed in claim 8, wherein each of the first convex surface and the second convex surface is an ellipsoidal surface with a long axis thereof substantially parallel to the first direction, and a short axis thereof substantially parallel to the second direction.

15. The illumination device as claimed in claim 8, wherein each of the second curved surface and third curved surface is a cylindrical surface.

16. The illumination device as claimed in claim 8, wherein the light incident surface comprises a first concave curved surface, the first concave curved surface diverges the light accessing therein, the light diverging power of the first concave curved surface on the first direction is smaller than the light diverging power of the first concave curved surface on the second direction.

17. The illumination device as claimed in claim 16, wherein the light incident surface comprises a second concave curved surface and a third concave curved surface, the second concave curved surface and the third concave curved surface are arranged symmetrically at two sides of first concave curved surface, the second concave curved surface, the first concave curved surface, and the third concave curved surface are connected in sequence along the second direction, the light diverging power of each of the second concave curved surface and the third concave curved surface on the second direction is smaller than that of the first concave curved surface.

* * * * *